United States Patent [19]

Ikeda et al.

[11] 4,270,265
[45] Jun. 2, 1981

[54] METHOD OF MANUFACTURING HYBRID INTEGRATED CIRCUIT ASSEMBLIES

[75] Inventors: Yoshihiko Ikeda, Shizuoko; Hiroyasu Nitou, Fuji, both of Japan

[73] Assignee: Kokusan Denki Co., Ltd., Numazu, Japan

[21] Appl. No.: 22,039

[22] Filed: Mar. 19, 1979

[30] Foreign Application Priority Data

Apr. 28, 1978 [JP]  Japan ................................. 53-50107

[51] Int. Cl.$^3$ ............................................. H05K 3/34
[52] U.S. Cl. ...................................... 29/840; 29/418; 29/760; 361/400
[58] Field of Search ................. 29/626, 628, 760, 577, 29/418, 840; 228/219, 220; 361/412, 413; 339/17 M, 17 LM

[56] References Cited

U.S. PATENT DOCUMENTS

| | | | |
|---|---|---|---|
| 2,740,097 | 3/1956 | Edelman et al. | 339/17 M |
| 3,218,585 | 11/1965 | May | 339/17 M X |
| 3,247,577 | 4/1966 | Jaremus et al. | 29/577 X |
| 3,266,125 | 8/1966 | Tobolski | 29/626 X |
| 3,540,718 | 11/1970 | Heffron et al. | 29/626 X |
| 3,665,590 | 5/1972 | Percival | 228/220 X |
| 4,158,877 | 6/1979 | Peterson | 361/412 |

FOREIGN PATENT DOCUMENTS 345814  4/1976  U.S.S.R. .................................. 228/219

*Primary Examiner*—Francis S. Husar
*Assistant Examiner*—C. J. Arbes
*Attorney, Agent, or Firm*—Pearne, Gordon, Sessions, McCoy and Granger

[57] ABSTRACT

Electronic components and a conductor for connecting the electronic components are placed in the component positioning holes and the conductor positioning recess which are formed in a plate-shaped jig. The jig with the components and the conductor is placed over a mounting board, and the assembly of these elements is heated in a suitable furnace so that the electronic components are connected to the mounting board and the conductor simultaneously, thereby to reduce the number of steps of manufacturing the hybrid integrated circuit assembly.

4 Claims, 11 Drawing Figures

METHOD OF MANUFACTURING HYBRID INTEGRATED CIRCUIT ASSEMBLIES

BACKGROUND OF THE INVENTION

This invention relates to a method of manufacturing a hybrid integrated circuit assembly which is formed by mounting electronic components on an electrically conductive mounting board.

In circuits disposed in high temperature environments, such as internal combustion engine ignition circuits or voltage control circuit for magnet type generators driven by internal combustion engines, the electronic components are mounted on a mounting board made of electrically conductive material such as copper or aluminum excellent in heat conductivity in order to improve the heat radiation.

Shown in FIG. 1 is a conventional hybrid integrated circuit assembly of this type, which forms a circuit as shown in FIG. 2. The hybrid integrated circuit assembly, as shown in FIG. 1, comprises: mounting boards 1' and 2'; diodes 3 and 4; and a thyristor 5. In a conventional method of manufacturing this hybrid integrated circuit assembly, first the cathode of the diode 3 is bonded to the mounting board 1', and the cathode of the diode 4 and the anode of the thyristor 5 are bonded to the mounting board 2' to respectively mount the diode 3, and the diode 4 and a thyristor 5 on the mounting boards 1' and 2'. Then the anode 3a of the diode 3 is connected to the anode 4a of the diode 4 with a lead wire 6 while the anode 4a of the diode 4 is connected to the cathode 5k of the thyristor 5 with a lead wire 7.

However, this conventional method is disadvantageous in that, since the connection of the lead wires 6 and 7 is effected with a wire bonder, the diameter of each of the lead wires 6 and 7 must be necessarily small, which results in the limitation of the current capacity. Furthermore, it is necessary to carry out the mounting of the diodes and the thyristor and the connection of the lead wires in separate processes, and in order to connect the lead wires to the diodes and the thyristor the bonding of the lead wires must be effected for every connection point. This increases the number of steps of manufacturing the assembly, which leads to an increment in manufacturing cost. This is another drawback accompanying the conventional method of manufacturing a hybrid integrated circuit assembly.

SUMMARY OF THE INVENTION

Accordingly, an object of this invention is to eliminate the above-described difficulties accompanying a conventional method of manufacturing a hybrid integrated circuit assembly.

More specifically, an object of the invention is to provide a method of manufacturing a hybrid integrated circuit assembly in which mounting electronic components on a mounting board and connecting the electronic components can be achieved simultaneously, and the electronic components are connected to one another with electrical conductors whose sections are much larger than those employed in the conventional method.

The novel features which are considered characteristic of this invention are set forth in the appended claims. This invention itself, however, as well as other objects and advantages thereof will be best understood by reference to the following detailed description of illustrative embodiments, when read in conjunction with the accompanying drawings, in which like parts are designated by like reference numerals or characters.

DETAILED DESCRIPTION OF THE INVENTION

Figure 1:
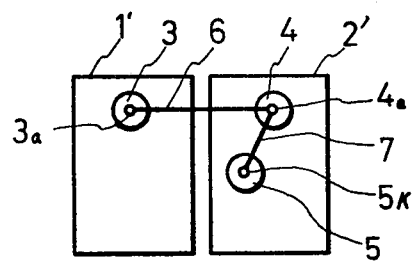
FIG. 1 is a plan view showing one example of a hybrid integrated circuit assembly formed according to a conventional method.
Figure 2:
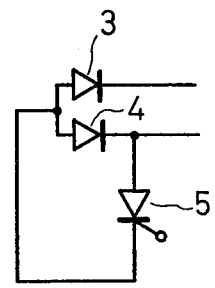
FIG. 2 is a circuit diagram of the hybrid integrated circuit assembly shown in FIG. 1.
Figure 3:
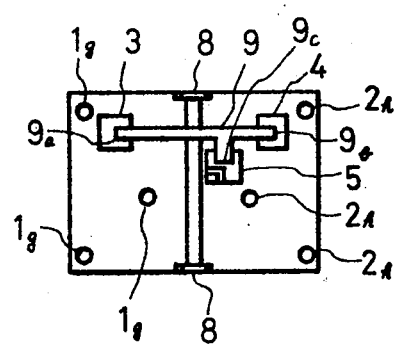
FIGS. 3 and 4 are a plan view and a front view showing one example of a hybrid integrated circuit assembly manufactured according to a method of this invention.
Figure 4:
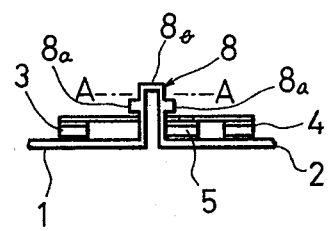

One example of a method of manufacturing a hybrid integrated circuit assembly according to this invention will be described with reference to FIGS. 3 and 4 which show the arrangement of various components to form the circuit as shown in FIG. 2.

Figure 5A:
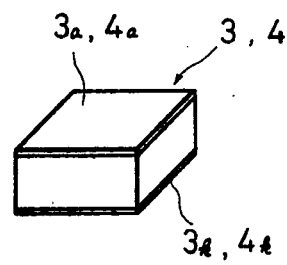
FIGS. 5A and 5B are perspective views illustrating electronic components mounted on a mounting board according to the method of this invention.
Figure 5B:
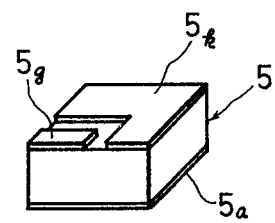

In this assembly, mounting boards 1 and 2 are coupled to each other by means of inverted-U-shaped coupling members 8 and 8. Each of the coupling members 8 has protrusions 8a protruded sideward, and a top portion 8b above the protrusions 8a. The two mounting boards can be electrically and mechanically separated from each other by cutting off the top portions 8b along line A—A in FIG. 4. In the example shown in FIGS. 3 and 4, the chips of diodes 3 and 4, and the chip of a thyristor 5 are mounted on the mounting boards. Each chip has electrodes on the opposite end faces, which can be soldered. For instance, the chip of the diode 3 (or 4) has the cathode 3k (or 4k) and the anode 3a (or 4a) respectively on its both end faces as shown in FIG. 5A; and the chip of the thyristor 5 has the anode 5a on one end face, and the cathode 5k and the gate 5g on the opposite end face as shown in FIG. 5B. These components are soldered to the mounting boards 1 and 2. A connecting conductor 9 is soldered to the electrodes of the components which are provided on the end faces opposite to the end faces which have been soldered to the mounting boards. In this example, the cathodes 3k and 4k of the diodes 3 and 4 are soldered to the mounting boards 1 and 2, respectively, and the anode 5a of the thyristor 5 is soldered to the mounting board 2. The connecting conductor 9 consists of an arm having end portions 9a and 9b which are soldered to the anodes 3a and 4a of the diodes 3 and 4, respectively, and an arm extended from the aforementioned arm and having an end portion 9c which is soldered to the cathode 5k of the thyristor 5.

Figure 6:
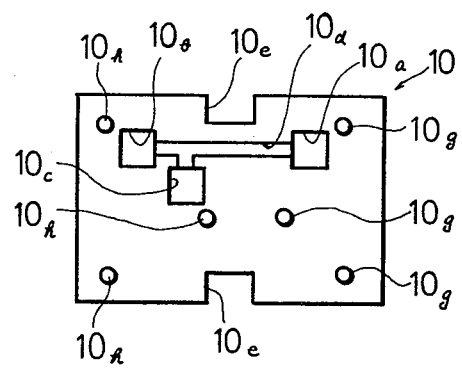
FIG. 6 is a bottom view showing one example of a jig employed in the method according to the invention.
Figure 7:
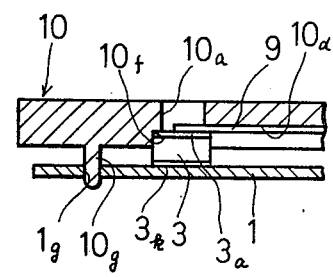
FIG. 7 is a fragmentary enlarged view showing the jig coupled to the mounting board.

In practicing the method of this invention, a jig 10 like a plate as shown in FIG. 6 is employed. The jig 10 is made of a heat-resisting material such as metal. The jig 10 has component positioning holes 10a, 10b and 10c into which the diodes 3 and 4 and the thyristor 5 can be inserted, and a connecting conductor positioning recess 10d into which the connecting conductor 9 can be inserted. This jig 10 is placed in parallel with the mounting boards 1 and 2 in such a manner that the recess 10d confronts the mounting boards 1 and 2. The jig 10 is further provided with cuts 10e and 10e in the substantially middle portions of both sides thereof, through which the coupling members 8 and 8 for connecting the mounting boards 1 and 2 to each other are inserted. The component positioning holes 10a through 10c are through-holes. Each of these component positioning holes has a component positioning shoulder 10f in its opening end on the side of the mounting board as shown in FIG. 7. The jig 10 further comprises a suitable number of protrusions 10g and 10h provided on one surface thereof. These protrusions 10g and 10h are elastically fitted, or press-fitted, into the corresponding holes 1g and 1h formed in the mounting boards 1 and 2, so that the jig 10 is fixedly coupled to the mounting boards 1 and 2.

In practicing the method according to the invention, first the connecting conductor 9 is inserted into the connecting conductor positioning recess 10d of the jig 10, and thereafter the diodes 3 and 4 and the thyristor 5 are inserted into the component positioning holes 10a, 10b and 10c, respectively, in such a manner that the anodes of the diodes 3 and 4 and the cathode of the thyristor 5 are in contact with the end portions 9a, 9b and 9c of the connecting conductor 9. It is preferable that the electrodes of these components are coated with solder before this insertion.

Then, the protrusions 10g and 10h of the jig 10 are inserted into the holes 1g and 1h of the mounting boards 1 and 2 which have been joined together by means of the coupling members 8, so that the diodes 3 and 4, the thyristor 5 and the connecting conductor 9 are held between the jig 10 and the mounting boards 1 and 2 (FIG. 7). Thereafter, the assembly of these elements is heated in a furnace filled with a reducing gas such as hydrogen or filled with an inert gas such as nitrogen or helium to melt the solder layers of the electrodes, as a result of which the components are welded to the mounting boards and the connecting conductor simultaneously.

Then, the jig 10 is removed from the mounting boards 1 and 2. Thereafter, the top portions of the coupling members 8 are cut off to electrically separate the mounting board 1 from the mounting board 2. The protrusions 8a of the coupling members 8 can be utilized as terminals. That is, if lead wires are connected to the protrusions 8a, electrical connection for the mounting boards can be achieved.

Figure 8:
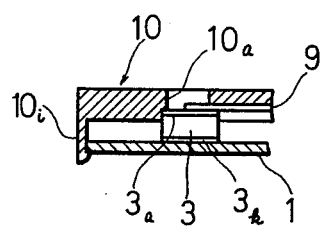
FIGS. 8 and 9 are sectional views for a description of different methods of engaging the jig with the mounting board.
Figure 9:
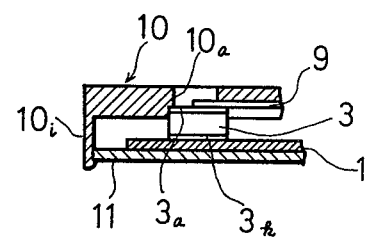

In the above-described example, the protrusions 10g and 10h of the jig 10 are inserted into the holes 1g and 1h of the mounting boards 1 and 2, to couple the jig 10 to the mounting boards 1 and 2. However, it should be noted that the invention is not limited thereto or thereby. For instance, the same effect can be obtained by firmly catching the edges of the mounting boards with hook-shaped locking protrusions 10i formed at the edges of the jig 10 as shown in FIG. 8. Alternatively, a method as shown in FIG. 9 may be employed. In this method, a suitable board 11 is placed on the surface of the mounting boards 1 and 2, which is opposite to the surface confronting the jig 10, and the jig 10 is engaged with the board 11, so that the jig 10 is indirectly coupled to the mounting boards 1 and 2.

In the above-described examples, one jig 10 is employed for a pair of mounting boards 1 and 2. However, if the size of the jig is increased, a plurality of paired mounting boards can be treated with one jig.

Figure 10:
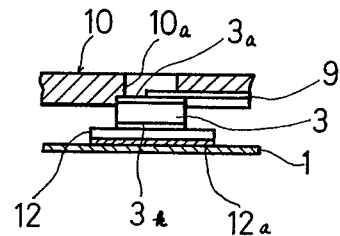
FIG. 10 is a sectional view illustrating one modification of the method of mounting electronic components on the mounting board.

In the above-described examples, one electrode of each component is connected directly to the mounting board. However, in the case where it is necessary to electrically insulate a component from the mounting board, for instance an insulating board 12 may be interposed between the diode 3 and the mounting board 1 as shown in FIG. 10. In this case, an insulating board on both surfaces of which metal layers are formed may be employed as the insulating board 12, because if a solder layer 12a is formed on the surface of the insulating board 12 confronting the mounting board 1, the diode 3 can be secured through the insulating board 12 to the mounting board 1. Furthermore, if an electrically conductive layer having a predetermined pattern is formed on the surface of the insulating board 12 opposite to the surface confronting the mounting board, then the electrode of the diode 3 can be connected through this electrically conductive layer to the electrodes of the other components.

In the above description, the electrodes of the components are coated with solder in advance; however, the same effect may be obtained by placing a sheet of solder on a part to be soldered. In general, the use of a furnace filled with a reducing gas permits soldering without flux; however, flux may be used if necessary.

In the above description, the number of mounting boards is two for forming one circuit; however, it should be noted that the invention is not limited thereto or thereby. Furthermore, in the above-described example, the diodes and the thyristor are mounted on the mounting boards; however, it goes without saying that other electrical components such as transistors, resistors and capacitors can be mounted on the mounting boards according to the method of the invention.

As is apparent from the above description, according to the invention, mounting electrical components on mounting boards and connecting the electrical components to one another can be achieved simultaneously. Therefore, the number of steps of manufacturing a circuit can be reduced, which results in an improvement in manufacturing efficiency. Furthermore, since the connecting conductor is soldered to the components, the conductor may be sufficiently large in sectional area. Accordingly, unlike the conventional method, the method according to the invention can eliminate the drawback that the current capacity is limited by connecting conductors.

What is claimed is:

1. A method of manufacturing a hybrid integrated circuit assembly wherein a plurality of electronic components are mounted on an electrically conductive mounting board and a connecting conductor means is disposed on the electronic components to electrically connect the electronic components to each other, comprising the steps of:

(a) interposing layers of solder between said mounting board and first electrodes respectively provided on first surfaces of said electronic components to be connected to said mounting board, and between second electrodes respectively provided on second surfaces of said electronic components opposite to said first surfaces thereof and said connecting conductor means for connecting said second electrodes to each other, said mounting board comprising at least two relatively thin conductive and solderable plates and a coupling means for mechanically connecting said plates to each other;

(b) placing said electronic components between said mounting board and a jig plate for positioning said electronic components with respect to said mounting board and for positioning said connecting conductor means with respect to said electronic components, and placing said connecting conductor means between said electronic components and said jig plate;

(c) holding said electronic components and said connecting conductor means between said mounting board and said jig plate to form a semi-assembly of said mounting board, electronic components and connecting conductor means;

(d) heating said semi-assembly to melt said layers of solder to simultaneously form the electrical and mechanical connection of said first electrodes to said mounting board and the electrical and mechanical connection of said second electrodes to said connecting conductor means, to thereby form said hybrid integrated circuit assembly;

(e) removing said jig plate from said hybrid integrated circuit assembly; and (f) cutting said coupling means to electrically and mechanically separate said mounting board into at least two sections.

2. A method as defined in claim 1, wherein said jig plate is provided with holes for positioning said electronic components with respect to said mounting board, a recess for positioning said connecting conductor means with respect to said second electrodes of said electronic components, a means for engaging said jig plate with said mounting board, and cuts for inserting said coupling means therein;

said steps of placing said electronic components between said mounting board and said jig plate and placing said connecting conductor means between said electronic components and said jig plate are simultaneously accomplished through said holes, recess and cuts; and said step of holding said electronic components and said connecting conductor means between said mounting board and said jig plate is accomplished through said means for engaging said jig plate with said mounting board.

3. A method as defined in claim 1, wherein said method is practised by employing a mounting board comprising at least two relatively thin conductive and solderable plates and a coupling means integrally formed with said plates between said plates, said coupling means being formed into a substantially inverted U-shape.

4. A method as defined in claim 3, wherein said coupling means of said mounting board has projections provided opposite to each other in the lateral direction thereof and a top portion above said projections, and said step of cutting said coupling means is accomplished at said top portion of said coupling means.

* * * * *